US008602289B2

(12) United States Patent
Goto et al.

(10) Patent No.: US 8,602,289 B2
(45) Date of Patent: Dec. 10, 2013

(54) ROOM TEMPERATURE BONDING USING SPUTTERING

(75) Inventors: Takayuki Goto, Yokohama (JP); Jun Utsumi, Yokohama (JP); Kensuke Ide, Ritto (JP); Hideki Takagi, Tsukuba (JP); Masahiro Funayama, Tokyo (JP)

(73) Assignees: Mitsubishi Heavy Industries, Ltd., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/438,346

(22) PCT Filed: Sep. 6, 2007

(86) PCT No.: PCT/JP2007/067427
§ 371 (c)(1),
(2), (4) Date: Aug. 24, 2009

(87) PCT Pub. No.: WO2008/029885
PCT Pub. Date: Mar. 13, 2008

(65) Prior Publication Data
US 2010/0000663 A1    Jan. 7, 2010

(30) Foreign Application Priority Data
Sep. 6, 2006    (JP) .................................. 2006-241961

(51) Int. Cl.
*B23K 20/12*    (2006.01)
*B23K 31/02*    (2006.01)
*B23K 1/20*    (2006.01)
*C23C 14/00*    (2006.01)

(52) U.S. Cl.
USPC ........... 228/115; 228/116; 228/205; 228/208; 204/192.11

(58) Field of Classification Search
USPC ........................... 204/192.11, 298.13
See application file for complete search history.

(56) References Cited

U.S. PATENT DOCUMENTS 4,008,844 A    2/1977    Duvall et al.
4,011,982 A    3/1977    Marancik
(Continued)

FOREIGN PATENT DOCUMENTS

JP    61-67581 A    4/1986
JP    62-22712 B2    5/1987
(Continued)

OTHER PUBLICATIONS

Hideki Takagi, "Report of Mechanical Engineering Laboratory", No. 189, Chapter 8, Dec. 2000, pp. 32-84.
(Continued)

*Primary Examiner* — Kiley Stoner
*Assistant Examiner* — Carlos Gamino
(74) *Attorney, Agent, or Firm* — Birch, Stewart, Kolasch & Birch, LLP

(57) ABSTRACT

A method of room-temperature bonding a plurality of substrates via an intermediate member, includes: forming the intermediate member on a surface to be bonded of the substrate by physically sputtering a plurality of targets; and activating the surface to be bonded by an ion beam. Preferably, the target composed of a plurality of types of materials is physically sputtered. Since the materials of the intermediate member are sputtered from the plurality of targets arranged in various directions from the surface to be bonded of the substrate, the intermediate member can be uniformly formed on the surface to be bonded. Further, since the intermediate member is composed of the plurality of types of materials, the room-temperature bonding of substrates difficult to bond together when an intermediate member is composed of a single type of material can be performed without heating and excessively pressing the substrates during bonding.

11 Claims, 9 Drawing Sheets

(56) References Cited

U.S. PATENT DOCUMENTS

| | | | |
|---|---|---|---|
| 4,038,041 A | 7/1977 | Duvall et al. | |
| 4,245,768 A | 1/1981 | Sater | |
| 4,349,954 A | 9/1982 | Banks | |
| 4,452,389 A | 6/1984 | Amin | |
| 4,749,118 A | 6/1988 | Yokoi et al. | |
| 4,988,035 A | 1/1991 | Ueno et al. | |
| 5,083,104 A | 1/1992 | Bassino | |
| 5,089,104 A * | 2/1992 | Kanda et al. | 204/192.11 |
| 5,148,958 A * | 9/1992 | Eskandari et al. | 228/3.1 |
| 5,372,298 A | 12/1994 | Glaeser | |
| 5,466,355 A * | 11/1995 | Ohhashi et al. | 204/298.13 |
| 5,543,019 A * | 8/1996 | Lee et al. | 204/192.15 |
| 5,549,237 A * | 8/1996 | Oeftering et al. | 228/116 |
| 5,741,404 A * | 4/1998 | Cathey | 204/192.11 |
| 5,967,402 A | 10/1999 | Kuwabara | |
| 6,106,960 A | 8/2000 | Fujii et al. | |
| 6,199,748 B1 | 3/2001 | Zhu et al. | |
| 6,224,718 B1 * | 5/2001 | Meyer | 204/192.12 |
| 6,315,188 B1 | 11/2001 | Cadden et al. | |
| 6,402,900 B1 * | 6/2002 | Baldwin et al. | 204/192.11 |
| 6,413,589 B1 | 7/2002 | Li | |
| 6,783,637 B2 * | 8/2004 | Slaughter et al. | 204/192.11 |
| 7,165,712 B2 | 1/2007 | Abdo et al. | |
| 7,331,092 B2 | 2/2008 | Miura et al. | |
| 7,565,996 B2 | 7/2009 | Das | |
| 7,632,470 B2 | 12/2009 | Tabata et al. | |
| 2001/0045352 A1 * | 11/2001 | Robinson et al. | 204/192.11 |
| 2003/0168145 A1 | 9/2003 | Suga et al. | |
| 2004/0226162 A1 | 11/2004 | Miura et al. | |
| 2005/0229737 A1 | 10/2005 | Tsuno et al. | |
| 2006/0140829 A1 | 6/2006 | Tabata et al. | |
| 2006/0249372 A1 * | 11/2006 | Xiang et al. | 204/192.11 |

FOREIGN PATENT DOCUMENTS

| | | | |
|---|---|---|---|
| JP | 62-268788 A | 11/1987 | |
| JP | 62-282788 A | 12/1987 | |
| JP | 63-101085 A | 5/1988 | |
| JP | 3-81077 A | 4/1991 | |
| JP | 4-46070 A | 2/1992 | |
| JP | 6-99317 A | 4/1994 | |
| JP | 7-96378 A | 4/1995 | |
| JP | 8-118043 A | 5/1996 | |
| JP | 8-318378 A | 12/1996 | |
| JP | 9-10963 A | 1/1997 | |
| JP | 10-92702 A | 4/1998 | |
| JP | 2791429 B2 | 6/1998 | |
| JP | 10-263849 A | 10/1998 | |
| JP | 2002-64042 A | 2/2002 | |
| JP | 2003-318219 A | 11/2003 | |
| JP | 2004-54170 A | 2/2004 | |
| JP | 2004-337927 A | 12/2004 | |
| JP | 2004-343359 A | 12/2004 | |
| JP | 2005-104810 A | 4/2005 | |
| JP | 2005-288673 A | 10/2005 | |
| JP | 2006-187685 A | 7/2006 | |
| WO | WO 2005/097396 A1 | 10/2005 | |

OTHER PUBLICATIONS

Takagi et al., "Corrosion resistant and highly reliable integration technology for MEMS devices", NEDO Preliminary Drafts of Research Promotion Project Accomplishment Debrief Session for the 15th year of the Heisei era, pp. 220-225, 2003.

Chinese Notice of Allowance issued in Chinese Patent Application No. 200780019998.8.

United States Notice of Allowance, dated Aug. 12, 2013, for U.S. Appl. No. 13/102,778.

* cited by examiner

ROOM TEMPERATURE BONDING USING SPUTTERING

BACKGROUND OF THE INVENTION

1. Field of the Invention

The present invention relates to a room-temperature bonding method and a room-temperature bonding apparatus. The present invention particularly relates to room-temperature bonding of substrates using an intermediate member.

2. Description of the Related Art

Basic technical contents of a room-temperature bonding method based on a surface activation method are disclosed in Japanese Laid-Open Patent Application JP-A-Showa 62-22712 (Japanese Patent JP1422397B) and Japanese Patent JP2791429B. However, since there are some materials difficult to bond together at a room temperature even by using this method, a bonding method in such a case is disclosed in following documents.

For example, after ion beams or atom beams using Ar or the like are irradiated onto surfaces to be bonded not only for removing contamination layers on the surfaces to be bonded but also for activating the surfaces to be bonded, an active ultrafine particle film is further formed on each of the surfaces to be bonded. At this time, as a method of forming an active layer, a target material is sputtered to thereby form the active ultrafine particle film on the surface to be bonded, opposed to the target. However, it is described that because of a low density of the ultrafine particle film, it is preferable to heat the surfaces so as to improve a degree of sintering during bonding (Japanese Laid-Open Patent Application JP-A-Heisei 6-99317).

Furthermore, various types of metal films each having good adhesiveness can be formed on diverse materials by using active Ti, Cr or the like as an intermediate layer. By using this intermediate layer to form a metal film on a surface of a material such as $SiO_2$ for which sufficient adhesion strength cannot be obtained by direct bonding based on the surface activation method, it is expected to be able to improve a performance of bonding of the material. Si, $SiO_2$ and $LiNbO_3$ are disclosed as examples of the material, and Pt as well as Ti and Cr is disclosed as an example of a material of the intermediate layer (Report of Mechanical Engineering Laboratory, No. 189, Chapter 8, December, 2000).

It is disclosed that irradiating inert gas ion beams or inert gas neutral atomic beams and metal ion beams or metal neutral atomic beams onto surfaces to be bonded of two substrates in vacuum to thereby form a metal thin film having a film thickness of 1 nm to 100 nm on each of the surfaces to be bonded of the substrates so as to bond, at a low temperature, the substrates having surfaces composed of ionic crystals and difficult to bond together by the conventional surface activation method. FIG. 6 shows an example of the irradiation. A $SiO_2$ substrate 107 is used as the substrate to be bonded, iron atoms 106 are used for the metal neutral atomic beam and argon atoms 105 are used for the inert gas neutral atomic beam. Each of the beams is irradiated from a beam irradiation unit 102 that includes therein an electrode 101, a beam source 103 and a grid 104. Specifically, the iron atoms 106 are generated as follows. The grid 104 composed of iron is disposed in an opening portion of the beam source 103, a part of argon atomic beams generated by applying a voltage to the electrode 101 from the beam source 103 strikes against the grid 104, and a part of the struck grid 104 is sputtered. Quartz, silicon oxide, silicon nitride, sapphire and $LiNbO_3$ are disclosed as examples of the ionic crystal, and iron, titanium and gold are disclosed as examples of a type of the metal. If the grid is replaced by another grid, the type of the metal can be changed. This method is characterized in that surface activation of the surface to be bonded of the substrate and deposition of a metal thin film are simultaneously performed. Therefore, by adjusting energy of either the ion beams or the neutral atomic beams, it is controlled to preferentially perform an action of activation or an action of metal thin film deposition. However, to improve a bonding strength, it is necessary to heat each substrate to 150° C. to 500° C. and to press the substrates by a roller during bonding. It is also necessary to produce another grid so as to change the type of the metal thin film. It is, therefore, not easy to change the type of the metal thin film (Japanese Laid-Open Patent Application JP2004-337927A).

A method of accelerating bonding is disclosed in which a metal thin film layer or an amorphous layer is formed on a bonding interface. This method is to bond a polycrystalline substance to a single-crystalline substance where it is difficult for both of the crystalline substances to realize a smooth surface roughness. The metal thin film layer is formed on a surface to be bonded of the polycrystalline substance, and the amorphous layer containing an element constituting the single-crystalline substance or an element of a metal constituting the metal thin film layer is formed on a surface to be bonded of the single-crystalline substance. Thereafter, the surfaces are activated and bonded to each other. Sintered ceramic is disclosed as the polycrystalline substance, and Si, SiGe and GaAs are disclosed as the single-crystalline substance. Pt (platinum) and Au (gold) are disclosed as the metal. As a method of forming the metal thin film, a sputtering film formation method is disclosed which uses an ion beam obtained by irradiating plasma ions onto a target and using recoil particles as film formation particles. This method is a method of bonding the substances by the amorphous layer produced by a reaction between the metal and the semiconductor, and application of the method is limited to semiconductor substrate materials (Japanese Laid-Open Patent Application JP2005-104810A).

SUMMARY OF INVENTION

As stated above, there is known the technique for improving the bonding strength by interposing another material between the surfaces to be bonded so as to bond two substrates that are difficult to bond by room-temperature bonding. However, if the room-temperature bonding is to be actually performed on substrates with the intermediate layer interposed between the substrates, there is a problem that a sufficient bonding strength cannot be obtained unless the conventionally used technique, such as heating and/or pressing of the substrates during bonding, is adopted since the bonding strength is insufficient at a room temperature. Furthermore, the sputtering by ion beams is used as the technique for forming the intermediate layer. However, a specific method and a specific apparatus configuration for uniformly forming the intermediate layer over entire surfaces of the substrates are not disclosed. Therefore, a room-temperature bonding method and a room-temperature bonding apparatus for ensuring a uniform bonding strength over the entire surfaces of the substrates are not disclosed. Moreover, a method of appropriately controlling composition of an intermediate member when bonding substrates with the intermediate member containing a plurality of types of metals interposed therebetween is not disclosed.

An object of the present invention is to provide a method and apparatus for uniformly forming an intermediate member on a surface of a substrate and obtaining a sufficient bonding strength even by room-temperature bonding without heating the substrates during bonding. Specifically, an object of the present invention is to provide a room-temperature bonding method and room-temperature bonding apparatus when an intermediate member is composed of a plurality of types of materials.

The present invention relates to a method and apparatus for room-temperature bonding substrates together using an intermediate member. By radiating ion beams or atom beams onto a target/targets composed of a plurality of types of materials and simultaneously sputtering the materials, the intermediate member is formed. The target/targets mentioned in the present invention refers/refer to materials of the intermediate member formed on a surface to be bonded of a substrate by sputtering.

A first aspect of the present invention is a method of room-temperature bonding a plurality of substrates via an intermediate member, including steps of: forming the intermediate member on a surface to be bonded of the substrate by physically sputtering a plurality of targets; and activating the surface to be bonded by ion beams. In this case, it is preferable that the target/targets composed of a plurality of types of materials is/are physically sputtered. Since the materials of the intermediate member are sputtered from the plurality of targets arranged in various directions from the surface to be bonded of the substrate, the intermediate member can be uniformly formed on the surface to be bonded. Further, since the intermediate member is composed of the plurality of types of materials, the room-temperature bonding of substrates difficult to bond together when an intermediate member is composed of a single type of material can be performed without heating and excessively pressing the substrates during bonding. Examples of the substrates include a silicon substrate and a $SiO_2$ substrate. Examples of the materials include metal and dielectric. Examples of the physical sputtering include sputtering by irradiation of an ion beam, sputtering by irradiation of a neutral particle beam (Fast Atom Beam, hereinafter referred to as "FAB"), sputtering by irradiation of plasma and sputtering by irradiation of a laser beam. When the beam is positively charged, electrons may be irradiated onto the beam from an electron gun to neutralize the beam so as to avoid charge-up on the surface to be bonded of each substrate. Further, the step of forming the intermediate member and the activation step may be executed in an arbitrary order. The activation may be performed after forming the intermediate member, the formation of the intermediate member and the activation may be performed simultaneously, or the intermediate member may be formed after the activation. Moreover, steps of a combination of these may be executed. For example, after performing only the activation, the activation and the formation of the intermediate member may be simultaneously performed. The order of the steps should be appropriately changed since a surface state of the surface to be bonded after forming the intermediate member and a surface state of the surface to be bonded after the activation depend on materials of the substrates and the intermediate member and conditions for sputtering and activation. Due to this, priorities of the steps cannot be uniformly decided. Namely, the order is decided depending on bonding conditions. However, it is more preferable to simultaneously perform the formation of the intermediate member and the activation since the number of steps can be reduced.

Moreover, by using an alloy as the target, a plurality of types of metals can be easily sputtered. By setting a composition ratio of the alloy to be equal to a desired composition ratio of the intermediate member, the intermediate member can be controlled to have a desired composition. As a result, by changing the composition ratio of the alloy based on the type of the substrate, a desired substrate bonding strength can be obtained. Nevertheless, a sputtering efficiency often differs depending on the type of metal of the target. In that case, if the composition ratio of the alloy is decided also in view of the efficiency, an intermediate member having a desired composition can be obtained.

Further, when a plurality of types of materials is arranged to be independent of one another as the target and the target is sputtered, it is possible to simultaneously sputter the plurality of types of materials. If it is difficult to produce an alloy composed of the plurality of types of metals, the intermediate member composed of the plurality of types of metals can be formed by independently arranging the metals and simultaneously sputtering the metals.

Furthermore, when an area ratio of surfaces of the plurality of types of materials to be irradiated with ion beams or atom beams is set based on the desired composition ratio of the intermediate member, the intermediate member can be controlled to have desired composition. As a result, by changing the composition ratio of the alloy based on the type of the substrates or changing the area ratio of the surfaces to be irradiated based on the plurality of types of materials, the intermediate member can be controlled to have a desired composition. Therefore, a desired substrate bonding strength can be obtained. In this case, similarly to the above-stated case, the sputtering efficiency often differs depending on the type of metal of the target. In that case, if the composition ratio of the alloy and the area ratio of the surfaces to be irradiated based on the materials are decided also in view of the efficiency, the intermediate member having the desired composition can be obtained.

A second aspect or the present invention is a room-temperature bonding apparatus including: a vacuum chamber; an evacuation apparatus evacuating the vacuum chamber; a pair of substrate holders arranged to face each other in the vacuum chamber; a pressure bonding mechanism connected to the substrate holder to bond substrates mounted on the respective substrate holders to each other; and a physical sputtering source, wherein a target irradiated with ion beams or atom beams emitted from the physical sputtering source is arranged in the vacuum chamber independently of the substrate holders, the pressure bonding mechanism and the physical sputtering source.

By arranging the target in the vacuum chamber independently of the other devices and the like, an intermediate member composed of a desired material with a desired composition ratio can be formed on a surface to be bonded of each substrate. Namely, it is possible to suppress the intermediate member from being composed of arbitrary metals possibly sputtered from the other devices or the like. Therefore, adhesion of the metal unnecessary for the intermediate member onto the surface to be bonded of each substrate can be suppressed, and the intermediate member suitable for a material of the substrates to be bonded can be selectively formed. As a result, the substrates that are conventionally difficult to bond together by room-temperature bonding can be bonded to each other at a desired bonding strength. Examples of the physical sputtering source include an ion beam source, an FAB source, a plasma source and a laser source. Examples of the energy beam include an ion beam, a neutral atomic beam, a beam of ions or neutral particles in plasma and a laser beam.

Furthermore, by mounting the target on a target substrate, the target necessary for bonding can be easily arranged in the vacuum chamber. This can facilitate fixing the target into the vacuum chamber. Besides, when a plurality of types of materials is used as the target and the materials are arranged independently of one another, then the materials are temporarily mounted on the target substrate and the target substrate is arranged in the vacuum chamber. This can facilitate handling such as replacement of the target as compared with arranging targets independently in the vacuum chamber. The target substrate mentioned in the present invention refers to a substrate for holding the target and is not a material composed of the intermediate member.

As a method of mounting the target on the target substrate, a bulk target such as a plate target may be attached onto the target substrate using a tool, a foil target may be bonded onto the target substrate, or a target film may be formed on the target substrate by PVD, CVD or plating.

Further, the target is composed of a plurality of types of metals and the plurality of types of metals is arranged to be independent of one another at a ratio based on the composition ratio of the intermediate member or arranged as an alloy having the ratio. By configuring the target to arrange the plurality of types of metals independently and sputtering the target, it is possible to simultaneously sputter the plurality of types of metals. When it is difficult to produce an alloy composed of the plurality of types of metals, the intermediate member composed of the plurality of types of metals can be formed by independently arranging the metals and simultaneously sputtering the metals. Furthermore, when an area ratio of surfaces of the plurality of types of materials to be irradiated with ion beams or atom beams is set based on the desired composition ratio of the intermediate member, the intermediate member can be controlled to have desired composition. As a result, by changing the composition ratio of the alloy based on the type of the substrates or changing the area ratio of the irradiated surfaces of the plurality of types of materials, a desired substrate bonding strength can be obtained. However, sputtering efficiency often differs depending on the types of materials of the target. In that case, when the composition ratio of the alloy and the area ratio of the irradiated surfaces of the plurality of materials are decided also in view of the efficiency, the intermediate member having the desired composition can be obtained.

Moreover, by composing the target by an alloy, the plurality of types of metals can be easily sputtered. By setting the composition ratio or the alloy based on the desired composition ratio of the intermediate member, the intermediate member can be controlled to have a desired composition. As a result, by changing the composition ratio of the alloy based on the type of the substrates, a desired substrate bonding strength can be obtained. In this case similarly to the above, the sputtering efficiency often differs depending on the types of metals of the target. In that case, when the composition ratio of the alloy is decided also in view of the efficiency, the intermediate member having a desired composition can be obtained.

Further, the surfaces to be irradiated of the target are arranged so that the number of the surfaces is plural so as to surround almost half a circumference of the substrate and are oriented in a perpendicular direction to the surface to be bonded of the substrate. To surround almost half the circumference of the substrate means that almost half the circumference is opened so as to prevent targets from cutting off ion beams or atom beams emitted from the physical sputtering source to the surfaces to be irradiated, and means that the surfaces to be irradiated can be appropriately arranged in a circumferential direction so as not to cut off the ion beams or atom beams. By arranging the targets to sandwich the surface to be bonded of the substrate from the circumferential direction, metals can enter a part of the surface to be bonded of the substrate farther from the targets and the intermediate member can be formed more uniformly on the surface to be bonded thereof.

Furthermore, a shape of the surface to be irradiated of the target is curved so that when the ion beams or atom beams emitted from the physical sputtering source to the surface to be irradiated generate sputtered atoms on respective portions of the target in directions of regular reflection, the sputtered atoms are parallel to one another toward a position of the surface to be bonded of the substrate. For example, the ion beams emitted from an ion beam source are emitted while being diffused. Due to this, if the ion beams reach the target at the same angles as those of the ion beams are diffused, each sputtered metal is emitted non-uniformly around an outgoing angle direction decided based on an incident angle of the beam. As a result, since the metals reaching the surface to be bonded of the substrate have a non-uniformly distribution and a thickness of the formed intermediate member has a non-uniformly distribution in a surface direction of the substrate. Therefore, when the shape of the surface to be irradiated of the target is curved so that the sputtered atoms are parallel with respect to the ion beams or atom beams while being diffused, the distribution of the thickness of the intermediate member in the surface direction of the substrate can be more uniformed. The incident rays refer to the ion beams or atom beams directed to the targets, and the outgoing rays refer to the sputtered atoms generated from the targets by the incident rays.

Further, the target substrate includes a mechanism for adjusting a distance between the surface to be irradiated of the target and the surface to be bonded of the substrate. By adjusting the distance between the surface to be irradiated of the target and the surface to be bonded of the substrate, amounts of metals sputtered from the targets can be adjusted and metal concentrations of the intermediate member formed on the surface to be bonded of the substrate can be set uniform in the surface. Besides, when the target or the target substrate physically disturbs carrying the substrate in and out from the substrate holders, a position of the target or the target substrate is moved to avoid the disturbance. Then, the substrate is disposed on the substrate holder. After that, the target or the target substrate is returned to a predetermined position and room-temperature bonding can be performed.

DETAILED DESCRIPTION OF THE INVENTION

Figure 1:
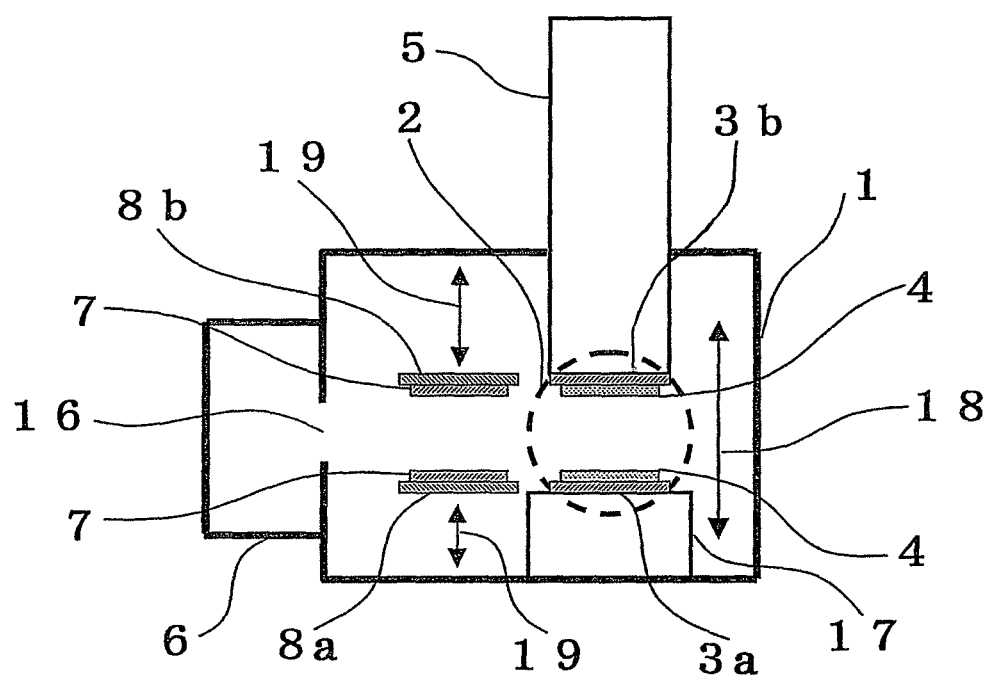
FIG. 1 is a cross-sectional front view of a room-temperature bonding apparatus according to the present invention.

FIG. 1 is a cross-sectional view of a room-temperature bonding apparatus according to the present invention. A vacuum chamber 1 is composed of stainless steel with a shape of a rectangular parallelepiped. An evacuation apparatus 2 for evacuating air from the vacuum chamber is attached to one of side surfaces of this vacuum chamber 1. In FIG. 1, an evacuation port with a circular form is shown as a part of the evacuation apparatus 2. Therefore, a direction of evacuating air from the vacuum chamber by this evacuation apparatus is a direction perpendicular to a paper surface. The evacuation apparatus is a combination of a turbo molecular pump and a rotary pump. A physical sputtering source 6 is also attached to one of the side surfaces of the vacuum chamber 1. The physical sputtering source 6 is attached to the side surface different from that to which the evacuation apparatus 2 is attached. An emission port 16 from which energy beams are emitted from the physical sputtering source 6 coincides with an opening provided in the side surface of the vacuum chamber 1. Accordingly, the energy beams such as ion beams or atom beams are generated in the physical sputtering source 6, pass through the emission port 16, and enter the vacuum chamber 1. In FIG. 1, the ion beams or atom beams are emitted from a left side toward a right side.

A pressure bonding mechanism 5, a mount 17 and substrate holders 3a and 3b are incorporated into the vacuum chamber 1. Each of the pressure bonding mechanism 5, the mount 17 and the substrate holders 3a and 3b is composed of stainless steel. A substrate 4 is mounted on the substrate holder 3a without being fixed to the substrate holder 3a, and the substrate holder 3b fixes the substrate 4 thereto by electrostatic chuck. The mount 17 is disposed on a bottom surface of the vacuum chamber 1. The substrate holder 3a is provided on the mount. A central position of the mount 17 coincides with a central position of the substrate holder 3a. Further, the pressure bonding mechanism 5 is disposed to penetrate through an upper surface of the vacuum chamber 1. A central position of a lower surface of the pressure bonding mechanism 5 coincides with a central position of an upper surface of the mount 17.

The substrate holder 3b is disposed on a lower surface of the pressure bonding mechanism 5. The central position of the bottom surface of the pressure bonding mechanism 5 coincides with a central position of the substrate holder 3b. The pressure bonding mechanism 5 is structured so that the lower surface of the pressure bonding mechanism 5 is movable in an axial direction of the mechanism. A position of the lower surface of the pressure bonding mechanism 5 on which the substrate holder 3b is disposed moves vertically as indicated by an arrow 18. A moving distance has a span of which the lower surface can be located downward of an upper surface of the substrate holder 3a disposed on the upper surface of the mount 17. The pressure bonding mechanism 5 is structured to be able to apply a load to the mount 17 when the lower surface of the pressure bonding mechanism 5 contacts with the upper surfaces of the mount 17. Central axes of the substrate holders 3a and 3b coincide with each other.

A target substrate 8a is disposed horizontally sideways to the substrate holders 3a and a target substrate 8b is disposed horizontally sideways to the substrate holder 3b. The target substrates 8a and 8b are composed of stainless steel. Each of the target substrates 8a and 8b has a moving mechanism that each target substrate 8a or 8b can move in a same direction as the arrow 18 indicating the moving direction of the pressure bonding mechanism 5. Each of the target substrates 8a and 8b has at least a mechanism that can move each target 7 to a position where an outgoing ray 9 from the physical sputtering source 6 does not cross a surface to be irradiated of each target 7. The reason why the components are composed of stainless steel is as follows. By not using the other materials as materials of the components, the components are prevented from becoming supply sources of unnecessary materials for the intermediate member.

Targets 7 are mounted on an upper surface of the target substrate 8a and a lower surface of the target substrate 8b, respectively. Each of the targets 7 is an alloy composed of a plurality of types of metals and is a bulk alloy with a plate shape. The target 7 is fixed to one target substrate 8 by screws. These screws are also composed of, for example, stainless steel so as not to become supply sources of the unnecessary materials for the intermediate member.

Positions and directions of the target substrates 8a and 8b are variable by mechanisms that are not shown. A distance between 8a and 8b, a distance between the substrate holders 3a and 3b, a direction of the physical sputtering source 6 with respect to the opening and a direction of the physical sputtering source 6 with respect to the substrate 4 are variable. Since a mechanism that directions of the ion beams or atom beams emitted from the physical sputtering source 6 can be changed will be complicated, the directions are almost set to fixed directions. By changing the positions and directions of the target substrate holders 8a and 8b, uniformity in a thickness of the intermediate member formed on a substrate surface in a direction of the substrate surface and uniformity in a concentration of the material composing the intermediate member are controlled.

Figure 2:
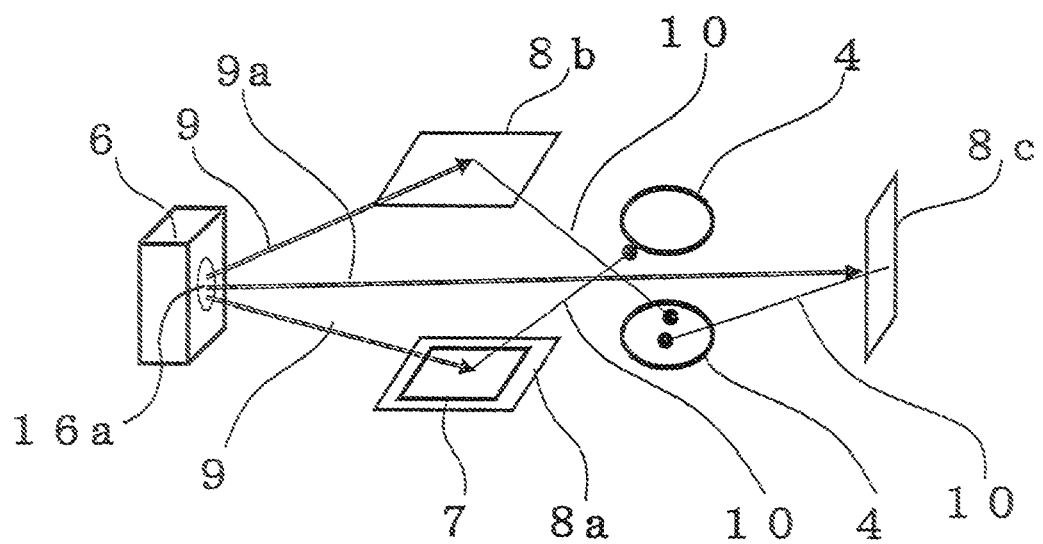
FIG. 2 is a perspective view showing an example of a method of forming intermediate members on substrates by sputtering targets according to a first embodiment of the present invention.

FIG. 2 is a perspective view of the room-temperature bonding apparatus. In the case of FIG. 1, a target substrate 8c may be disposed. The ion beams or atom beams 9 emitted from the physical sputtering source 6 are incident on targets mounted on the target substrates 8a, 8b and 8c, respectively. The metals composing the targets are sputtered and the sputtered metals are emitted from the targets to be sputtered atoms (sputter particles) 10 to the substrates 4. In FIG. 2, the reference symbols 9 represent the beams which are incident on a target 7 at each of the target substrates 8a, 8b and 8c, and the beam 9a which is directed toward target substrate 8c represents an axis line starting at the center 16a of the physical sputtering source 6 as shown and is parallel to a direction which the physical sputtering source faces.

FIGS. 1 and 2 do not show carrying in and out of the substrates 3a and 3b. For example, a robot arm may be provided in a load lock chamber disposed to communicate with the vacuum chamber 1, the substrates 4 may be disposed on the substrate holders 3a and 3b and the substrates 4 may be detached to be replaced by new substrates 4 after being processed.

Procedures of room-temperature bonding using the apparatus configured as stated above will be described. Here, it is assumed that the target substrates 8a and 8b and the targets 7 are disposed in advance. The substrates 4 to be bonded are transported into the vacuum chamber 1 by means which is not shown and mounted on the upper surface of the substrate holder 3a and on the lower surface of the substrate holder 3b. The substrate 4 is mounted on the substrate holder 3a without being fixed to the substrate holder 3a, while the other substrate 4 is mounted on the substrate holder 3b with being fixed to the substrate holder 3b by electrostatic chuck. At this time, the lower surface of the pressure bonding mechanism 5 is located at a higher position than the upper surface of the mount in a direction of gravitational force. After mounting the substrates, the opening from which the substrates are carried in and out of the vacuum chamber 1 is closed and evacuation of the air from the vacuum chamber 1 is started by the evacuation apparatus 2. After the vacuum chamber 1 reaches a predetermined degree of vacuum, the physical sputtering source 6 is actuated to emit, e.g., ion beams 9. The ion beams are incident on the targets 7 to emit elements composed of the targets 7. In this case, since each target 7 is composed of the alloy, a plurality of types of elements composed of the alloy is emitted by sputtering. The sputtered atoms 10, which are the plurality of types of metal atoms sputtered and emitted, reach the substrates 4 and are deposited on surfaces of the substrates 4. At the same time, the ion beams that are not incident on the targets 7 are incident on the surfaces to be bonded of the substrates 4. At this time, deposition of the metal atoms and activation of the surfaces to be bonded by sputter etching are simultaneously performed. A magnitude relationship between action of the deposition and that of the activation depends on arrangement of the targets 7, magnitudes of the ion beams 9 from the physical sputtering source 6 and an energy density distribution in a perpendicular direction to the ion beams 9. Therefore, the magnitude relationship between the action of the deposition and that of the activation is adjusted by setting them. Needless to say, such an adjustment that the action of sputter etching exceeds the action of deposition is not employed. The sputter etching means that a certain target matter is sputtered by irradiating the certain target matter with some energy beams and the irradiated portion is eventually and physically ground.

Figure 7A:
FIG. 7A is a side view showing substrates bonded to each other via an intermediate member.
Figure 7B:
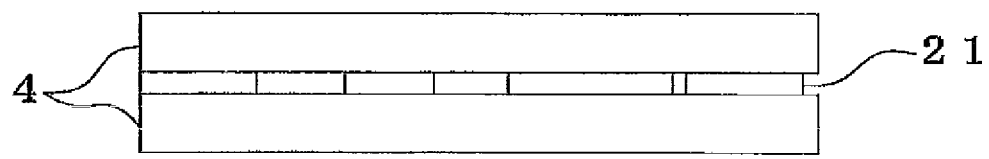
FIG. 7B is a side view showing substrates bonded to each other via an intermediate member.

After end of the deposition and the activation, the physical sputtering source 6 is stopped to stop the emission of the ion beams. Thereafter, the pressure bonding mechanism 5 is driven to make the lower surface of the pressure bonding mechanism 5 closer to the upper surface of the mount 17. When the surfaces to be bonded of the substrates 4 contact each other, a predetermined load is applied to the pressure bonding mechanism 5 and the application of the load is continued for predetermined time. After passage of the predetermined time, the pressure bonding mechanism 5 is drive in an opposite direction to the moving direction to make the lower surface of the pressure bonding mechanism 5 separate from the upper surface of the mount 17. At that moment, fixing of the substrate 4 to the substrate holder 3b is released. As a result, the substrates 4 bonded to each other via the intermediate member as shown in FIGS. 7A and 7B remain on the substrate holder 3a. FIG. 7A shows the intermediate member formed in a layer shape and FIG. 7B shows the intermediate member formed in a land shape. The bonded substrates 4 are carried out to the load lock chamber by the robot arm and then pulled out from the apparatus. New substrates are disposed in the load lock chamber and subjected to room-temperature bonding by the same method.

When the room-temperature bonding is performed as stated above, a plurality of types of metals is mixed into the surfaces to be bonded of the substrates as the materials of the intermediate member to form the intermediate member uniformly. Therefore, it is unnecessary to heat and excessively press the substrates as conventionally required in the bonding method, thereby making it possible to not only simplify the room-temperature bonding apparatus but also bond the substrates that are difficult to bond.

A first embodiment according to the present invention will be described referring to FIG. 2. The reference letters same as those shown in the other drawings denote the same elements, respectively. In this embodiment, the target substrate 8c is added to the configuration of the apparatus shown in FIG. 1 and the others of the configuration are the same as those shown in FIG. 1. The target substrate 8c has a same structure as that of the target substrates 8a and 8b. The target substrate 8c is disposed in a direction perpendicular to the target substrates 8a and 8b on an opposite side to the target substrates 8a and 8b with respect to the substrates 4 if viewed from the physical sputtering source 6. The direction in which the target substrate 8c is disposed also corresponds to a direction in which the surface of the target substrate 8c is set parallel to the opening 16 of the physical sputtering source 6. It is noted that the target substrate 8c is integrally arranged on an extension of the surface direction of the two substrates 4. Each target is plate-shaped and an alloy of iron, chromium and nickel. Alternatively, the alloy may be an alloy of metals selected from gold (Au), aluminum (Al), platinum (Pt), molybdenum (Mo), tungsten (W), titanium (Ti), tantalum (Ta), iridium (Ir), palladium (Pd), silver (Ag), copper (Cu), cobalt (Co), rhodium (Rh), ruthenium (Ru) and the like. As a method of mounting these elements on the target substrate 8, it suffices to fix the target 7 so as not to move on the target substrate 8 using a method of mounting a bulk alloy on the target substrate 8 and fixing it by screws or hooks. As the other fixing methods, a method of fixing by adhesive or soldering, a method of bonding by room-temperature bonding, a method of attraction by electrostatic chuck or the like may be used. The vacuum chamber 1 and the substrate holders 3a and 3b may be composed of aluminum. The material of the target substrates 8a, 8b and 8c may be composed of glass.

By employing the room-temperature bonding apparatus arranged as stated above, a plurality of types of atoms composed of the target 7 mounted on the substrate 8c is sputtered from the target 7 by the ion beams 9 to the target substrate 8c. The metal atoms emitted as the sputtered atoms 10 reach the substrate 4 and are deposited on the substrate 4, and the intermediate member can be formed. In this case, for formation of the intermediate member on the surface of the substrate 4 at a farther position from the physical sputtering source 6 with the target substrates 8a and 8b put between the physical sputtering source 6 and the target substrate 8c, the intermediate member is formed not only by using the target substrates 8a and 8b but also by using the target substrate 8c, wherein the metal atoms sputtered from the target 7 mounted on the target substrate 8c are deposited on the surface to be bonded of the substrate. Therefore, more uniform intermediate member can be formed on the surface to be bonded of the substrate 4. At the farther position, metals are sputtered from the target 7 at an angle corresponding to the ion beams 9 incident on the target 7 while being diffused, and the metals are sputtered from the target 7 with an emission amount corresponding to an energy density distribution in a perpendicular direction to the ion beams 9. Due to this, a rate of forming the intermediate member is relatively slow. The intermediate member is thinner, accordingly. Therefore, the target substrate 8c is provided in order to compensate for deposition of the intermediate member at the farther position.

The distance between the target substrate 8c and the substrate 4 may be appropriately adjusted based on a deposition situation of the intermediate member. The deposition situation is a distribution of a thickness of the intermediate member within the surface to be bonded.

In the above-stated embodiment, the method using all the target members 8a, 8b and 8c is shown. However, it is not necessarily to use all the target members 8a, 8b and 8c. For example, if there is no need to form the intermediate member on both of the surfaces to be bonded of the two substrates, only the target substrates 8b and 8c may be used without using the target substrate 8a. Furthermore, only the target substrate 8b may be used without using the target substrate 8c. Namely, as for an arrangement of the target substrates 8a, 8b and 8c to be used, a combination of the target substrates 8a, 8b and 8c can be appropriately decided. The number of target substrates 8 to be used may be decided in light of the rate of forming the intermediate member and the uniformity of the intermediate member, and it suffices to use only one target substrate 8 even if a plurality of types of metals is used as the materials of the intermediate member.

The activation may be performed after forming the intermediate member with a predetermined thickness. For example, after the thickness of the intermediate member becomes equal to the predetermined thickness by depositing a plurality of types of metals on the surface to be bonded of the substrate, the physical sputtering source 6 is stopped to stop emission of the ion beams. Thereafter, the positions of the target substrates 8a and 8b are moved to positions at which the ion beams 9 are not incident on the surfaces to be irradiated of the targets 7. The physical sputtering source 6 is then restarted to emit the ion beams such that the ion beams are incident on the surfaces to be irradiated, that is, the surfaces to be bonded of the substrates 4. By the ion beams being incident on the surfaces for predetermined time, the surfaces to be bonded of the substrates on which the intermediate member is previously formed are activated. In this case, the thickness of the intermediate member is estimated as several tens of nm. Due to this, if the activation is excessively performed and this intermediate member is thereby removed, the object of the present invention cannot be attained. It is necessary to perform the activation after forming the intermediate member while the ion beams are emitted at such intensity as not to remove the intermediate member entirely, or after ion beam irradiation time is adjusted.

Moreover, to carry the substrates in or out from the vacuum chamber 1, a load lock chamber communicating with the vacuum chamber 1 via a gate valve may be provided and a robot for receiving and supplying the substrates may be disposed in the communication portion between the vacuum chamber 1 and the load lock chamber.

Figure 3A:
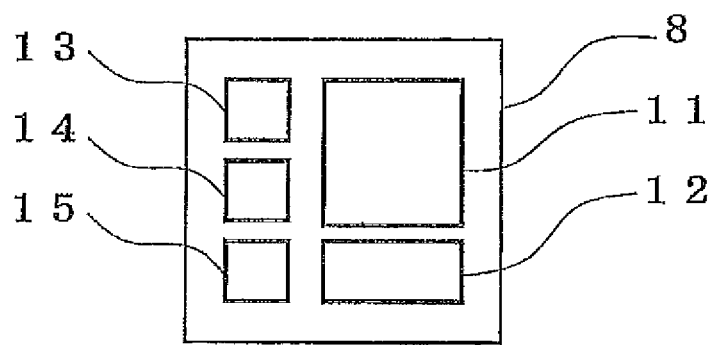
FIG. 3A is a top view showing an example of arranging a plurality of types of targets on a target substrate according to a second embodiment of the present invention.
Figure 3B:
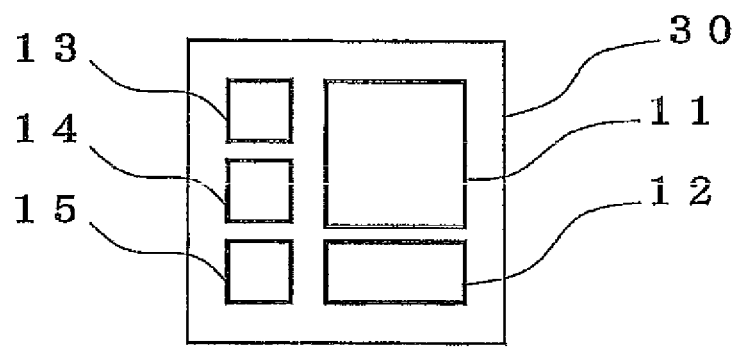
FIG. 3B is a top view showing an example of arranging a plurality of types of targets on a target substrate according to the second embodiment of the present invention.

Referring to FIGS. 3A and 3B, a second embodiment according to the present invention will be described. FIG. 3A shows an example of mounting targets on target substrates 8a, 8b and 8c in a different manner from the previous alloy. Reference letters 11 to 15 denote targets composed of different types of elements, respectively. While each target is the alloy in the first embodiment, the targets separately disposed corresponding to the elements on the target substrate in the second embodiment. The targets 11 to 15 are plate-shaped. Further, some of disposed areas of the targets 11 to 15 are different from the others, composition of the intermediate member is controlled by setting the disposed areas of the targets 11 to 15.

The target 7 may have a shape other than the plate shape. A method may be adopted such as a method of coating a material of the target 7 onto the target substrate 8, a method of forming a foil-shaped material of the target 7 and bonding it on the target substrate 8, or a method of forming a film composed of the material of the target 7 on the target substrate 8 by PVD (Physical Vapor Deposition), CVD (Chemical Vapor Deposition), plating or the like.

The target substrate 8 itself may be composed of some types of materials 30 which are some of components composing the intermediate member. This means that the target substrate 8 has a function to supply a part of types of materials composing the intermediate member and that each target 7 has a function to supply other parts of types of materials composing the intermediate member. If it is not desired to mix materials irrelevant to the composition of the intermediate member into the intermediate member from the target substrate 8 which has a possibility to be a supply source of the irrelevant materials, it is possible to suppress mixture of impurities for the intermediate member by providing the target substrate 8 with the types of the materials 30 composing the intermediate member (FIG. 3B).

By applying the second embodiment, it is possible to easily use a plurality of types of metals if the intended alloy shown in the first embodiment is composed of metals difficult to produce the alloy. Furthermore, when several composition ratios of a plurality of metals are intended to be tried or when the composition ratio is intended to be frequently changed based on the type of the substrates to be bonded, there is no need to produce a desired alloy on every occasion. Therefore, the intermediate member can be easily formed using a plurality of types of metals.

Figure 4A:
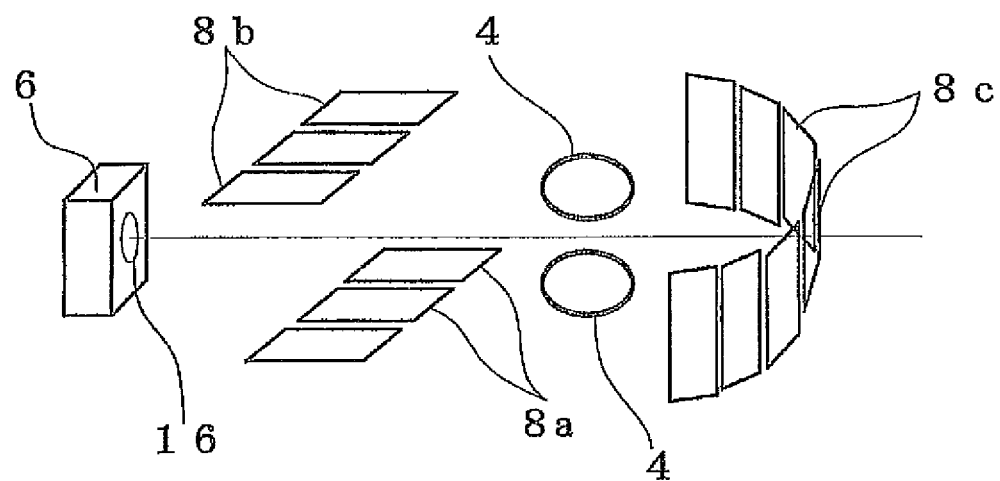
FIG. 4A is a perspective view showing a method of forming intermediate members on substrates by sputtering targets according to a third embodiment of the present invention.
Figure 4B:
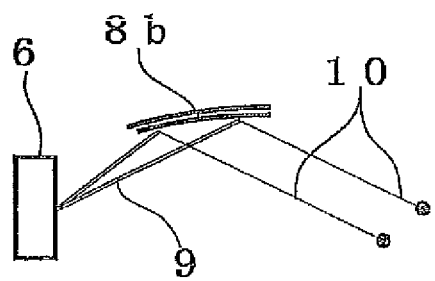
FIG. 4B is a side view showing the method of forming the intermediate members on the substrates by sputtering the target according to the third embodiment of the present invention.
Figure 4C:
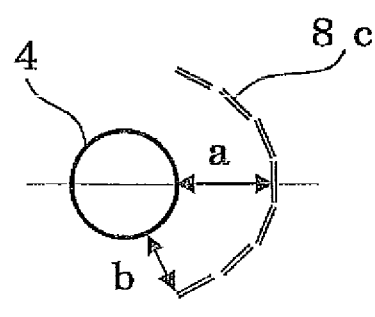
FIG. 4C is a top view showing the method of forming the intermediate members on the substrates by sputtering the targets according to the third embodiment of the present invention.

Referring to FIGS. 4A, 4B and 4C, a third embodiment according to the present invention will be described. The third embodiment is similar in a configuration to the first embodiment except for following three respects. A plurality of the target substrates 8a, a plurality of the target substrates 8b, and a plurality of the target substrates 8c are disposed (FIG. 4A). The target substrates 8a and 8b are curved (FIG. 4B). The target substrates 8c are arranged to surround the substrates 4 in a circumferential direction (FIG. 4C). A configuration of each target 7 may be either the configuration described in the first embodiment or that described in the second embodiment. The target substrates 8c may be curved similarly to the target substrates 8a and 8b.

As shown in FIG. 4A, by disposing, for example, three target substrates 8a, three target substrates 8b and seven target substrates 8c, an area of the sputtered targets 7 is wider than that when the number of the respective target substrates is one. Therefore, metals can be incident on the surfaces to be bonded of the substrates 4 so as to sufficiently cover areas of the surfaces to be bonded of the substrates 4. Accordingly, the intermediate members can be formed on the surfaces to be bonded of the substrates 4 more uniformly. Moreover, by physically surrounding the substrates to be bonded with the target substrates, it is possible to suppress mixture of unnecessary materials for the intermediate member from other portions such as an inner surface of the vacuum chamber 1.

As shown in FIG. 4B, a surface to be irradiated of each of the target substrates 8a and 8b is curved so that when the ion beams emitted from the physical sputtering source to the surface to be irradiated generate sputtered atoms on respective portions of the targets 7 in the direction of regular reflection, the sputtered atoms are parallel to one another toward the surface to be bonded of the substrate 4. For example, the ion beams 9 emitted from an ion beam source that is an example of the physical sputtering source 6 are emitted while being diffused. Due to this, if the ion beams are incident on the targets 7 at angles same as those the ion beams are diffused, each sputtered metal is emitted at an outgoing angle corresponding to an incident angle. As a result, the incident metals to the surface to be bonded of the substrate 4 have a non-uniform distribution and a thickness of a formed intermediate member has a non-uniform distribution in a surface direction of the substrate 4, accordingly. Therefore, if the shape of the surface to be irradiated of each target is curved so that the sputtered atoms are parallel with respect to the incident ion beams which are diffused, the distribution of the thickness of the intermediate member in the surface direction of the substrate 4 can be improved.

Figure 9:
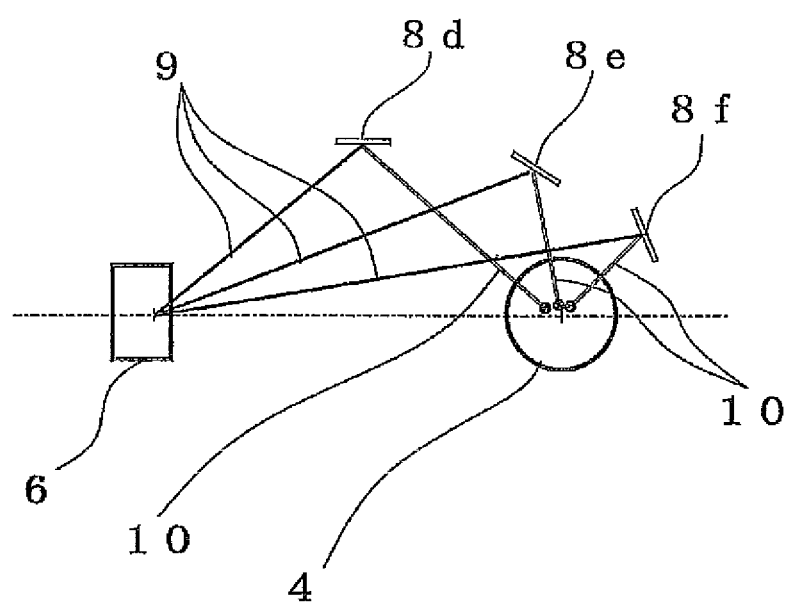
FIG. 9 is a top view showing the method of forming intermediate members on substrates by sputtering targets according to the third and fourth embodiments of the present invention.

Now, how to arrange the target substrates 8c will be described referring to FIG. 9. Target substrates 8d to 8f are labeled individually with respect to the target substrates 8c. For example, the target substrate 8d is arranged at a position closer to the physical sputtering source 6 and farther from the substrate 4 than any other target substrate. The target substrate 8f is arranged at a position farther from the physical sputtering source 6 and closer to the substrate 4 than any other target substrate. In FIG. 9, an arrangement of the target substrates 8d to 9f is shown only for a half (an upper half in FIG. 9) circumference of the substrate 4 but the arrangement thereof is the same for a remaining half (a lower half in FIG. 9) circumference of the substrate 4. A common respect of arrangement to the target substrates 8d to 8f is that a direction of each substrate is set so that the sputtered atoms (sputter particles) 10 from the each substrate converges at a central position of the substrate 4.

As for the target substrate 8d, the fact that the target substrate 8d is close to the physical sputtering source 6 means that the ion beams emitted from the source 6 are radiated onto the target substrate 8d while diffusion of the ion beams is small. Due to this, a density of metal particles emitted from the substrate 8d (a density of metal particles in the surface in the direction perpendicular to the ion beams 9) is high. However, because of a long distance from the substrate 8d to the substrate 4, the density decreases as the emitted metal particles are diffused and the metal particle density is low when the metal particles reach the substrate 4. On the other hand, as for the target substrate 8f, the fact that the target substrate 8f is far from the physical sputtering source 6 means that the ion beams emitted from the source 6 are radiated onto the target substrate 8f after diffusion of the ion beams becomes broad. Due to this, a density of metal particles emitted from the substrate 8f (a density of metal particles in the surface in the direction perpendicular to the ion beams 9) is low. However, because of a short distance from the substrate 8f to the substrate 4, the density does not decrease greatly when the metal particles reach the substrate 4. As a consequence, the sputtered atoms (sputter particles) 10 from the respective target substrates 8d to 8f are superimposed on the surface to be bonded of the substrate 4 and the intermediate member is formed uniformly from viewpoints of the entire surface to be bonded.

In an example of FIG. 9, the instance in which the number of target substrates is three (six if including three target substrates corresponding to the lower half of FIG. 9), that is, the target substrates 8d to 8f are described. However, the number of target substrates is not limited to three (six) but may be other than three. Distances between the target substrates exemplarily shown as those between the target substrates 8d to 8f may be arbitrarily set. Moreover, in FIG. 9, the surfaces to be irradiated of the target substrates 8d to 8f are oriented in a direction perpendicular to the surface to be bonded of the substrate 4. However, the direction is not limited to the perpendicular direction. An appropriate direction of the surfaces to be irradiated can be selected from among full angle directions with respect to the bonded surface of the substrate 4. Furthermore, while the flat surfaces to be irradiated are shown by way of example, the surfaces may be curved as exemplarily shown in FIG. 4B.

Moreover, as shown in FIG. 4C, a plurality of target substrates 8c is arranged so that the surfaces to be irradiated of the target substrates 8c surround the half circumference of the substrate 4 and is perpendicular to the surface to be bonded of the substrate 4. By arranging the targets so as to sandwich the surface to be bonded of the substrate from a circumferential direction, metals also reach an area of the surface to be bonded of the substrate farther from the targets 7 on the target substrates 8a and 8b and the intermediate member can be formed more uniformly on the bonded surface thereof. It is particularly preferable to set a distance "a" between the target substrate 8c arranged at a position facing an opening portion 16 of the physical sputtering source 6 and the substrate 4 to be wider than a distance "b" between the target substrate 8c arranged at a position away from the position facing the opening portion 16 of the physical sputtering source 6 and the substrate 4. The ion beams emitted from the physical sputtering source 6 have a density distribution that the density is high at a central position in the surface in a direction perpendicular to a forward direction and is low at peripheral positions. Due to this, by arranging the target 7 irradiated with the beam at the central position to be farther from the surface to be bonded of the substrate 4 and the target 7 irradiated with the beam at the peripheral positions to be closer to the surface to be bonded of the substrate 4, the intermediate member formed on the surface to be bonded can be made uniform in thickness.

In the third embodiment, the numbers of the target substrates 8a, 8b and 8c are set to three, three and seven, respectively. However, the numbers are not limited to these numbers. A size of one target substrate and the number of the target substrates may be appropriately decided based on a size and a shape of the substrate.

Figure 5A:
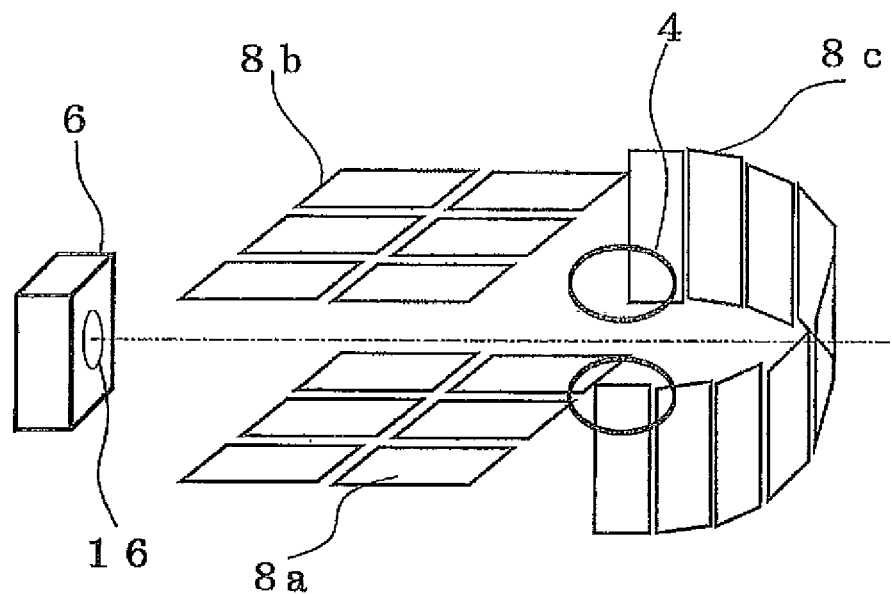
FIG. 5A is a perspective view showing a method of forming intermediate members on substrates by sputtering targets according to a fourth embodiment of the present invention.
Figure 5B:
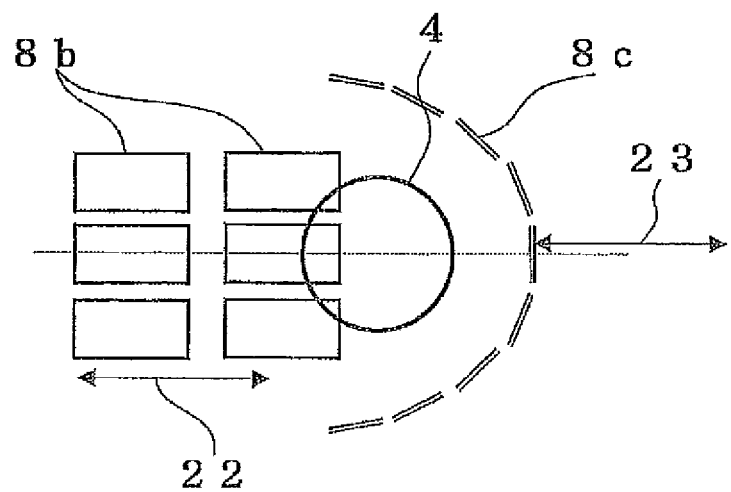
FIG. 5B is a top view showing the method of forming the intermediate members on the substrates by sputtering the targets according to the fourth embodiment of the present invention.
Figure 6:
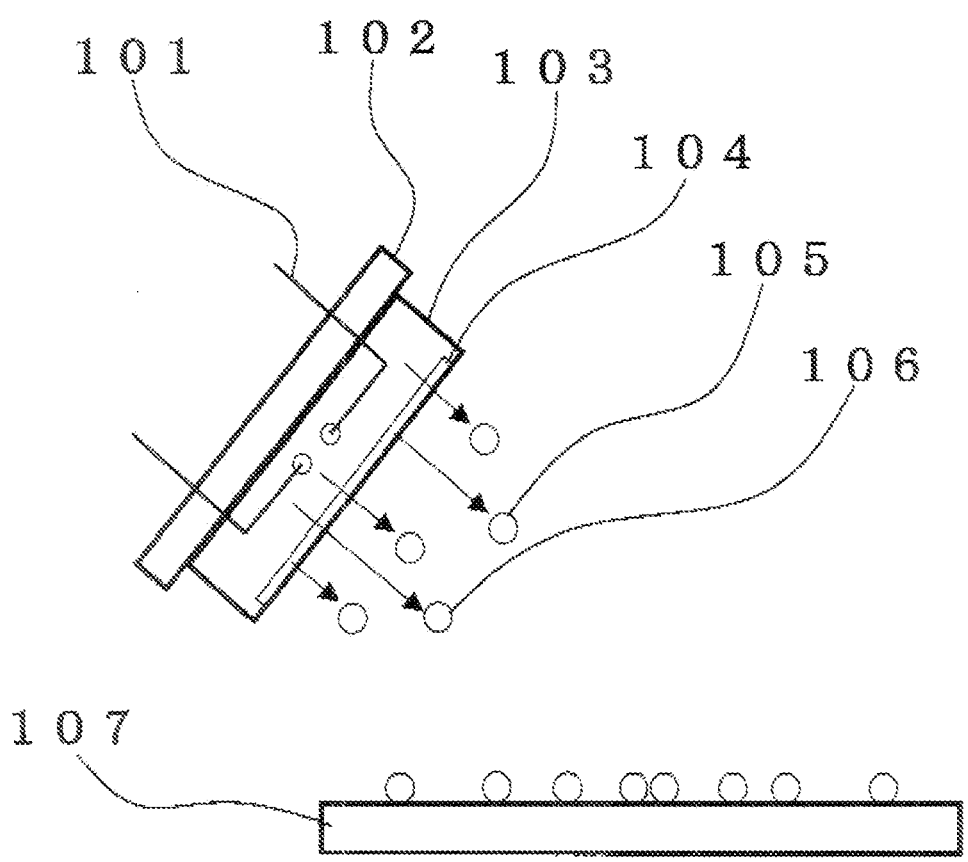
FIG. 6 is a cross-sectional view showing a conventional method of forming an intermediate member on a substrate by sputtering a target.

Referring to FIG. 5, a fourth embodiment according to the present invention will be described. The fourth embodiment is similar to the third embodiment in that a plurality of target substrates 8a, 8b and 8c is used but different from the third embodiment in that the arrangement of the target substrates 8a, 8b and 8c is changed as follows. A half circumference of the substrate 4 is surrounded by nine target substrates 8c and a remaining half circumference thereof is surrounded by six target substrates 8a and six target substrates 8b. FIG. 5A is a perspective view and FIG. 5B is a top view. By so arranging, more metals sputtered at the targets 7 can be incident on a surface to be bonded of the substrate. Further, this can suppress the mixture of particles supplied from an inner wall of the vacuum chamber 1 and components disposed in the vacuum chamber 1 as supply sources into the intermediate member.

However, with this arrangement, the substrate 4 cannot be carried in or out. Therefore, a drive mechanism (not shown) that can move the target substrates 8a and 8b in a direction of an arrow 22 and the target substrates 8c in a direction of an arrow 23 is provided. This drive mechanism drives the target substrates 8a, 8b and 8c to move in parallel. Alternatively, the drive mechanism may drive the target substrates 8c to move while changing a direction by 90° to be parallel to the substrate 4. Each target substrate 8c is rotated about an upper edge or a lower edge thereof set as an axis and changes the direction by 90°. In this way, by changing the direction of the target substrates 8c, a half space in the circumferential direction of the substrate 4 is opened, through which the substrate 4 can be carried in and out.

In the fourth embodiment, the numbers of the target substrates 8a, 8b and 8c are set to six, six and nine, respectively. However, the numbers are not limited to these numbers. A size of one target substrate and the number of the target substrates may be appropriately decided based on a size and a shape of the substrate.

Figure 8A:
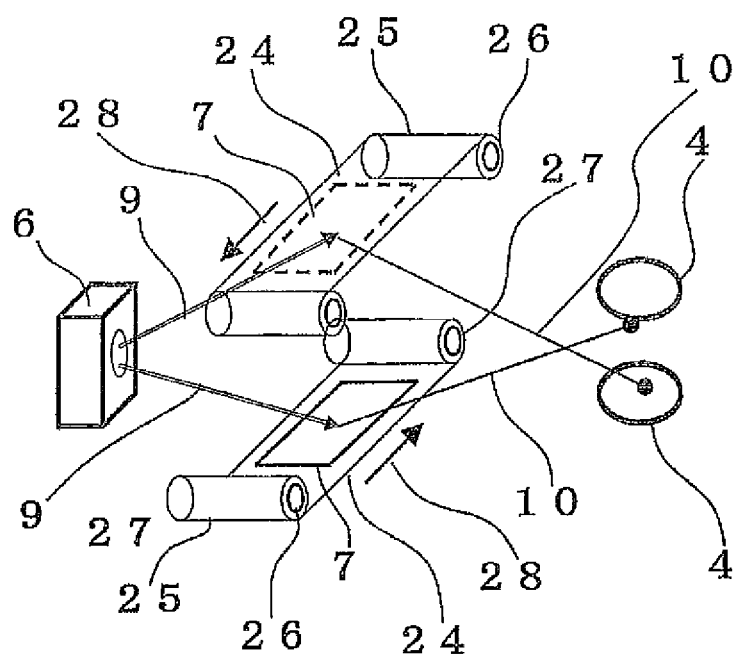
FIG. 8A is a perspective view showing a method of forming intermediate members on substrates by sputtering targets according to a fifth embodiment of the present invention.

Referring to FIG. 8A, a fifth embodiment according to the present invention will be described. The fifth embodiment is similar to the first embodiment except that the target substrates 8a and 8b used in the first embodiment are replaced by flexible substrates 24 and in that targets 7 are not bulk targets but foil targets. The flexible substrate 24 is a stainless steel thin plate, a resin film or the like. A target material is formed on the flexible substrate 24 in form of a foil. The target material may be formed on the flexible substrate 24 either entirely or partially. Alternatively, a plurality of types of materials may be formed partially, formed into a pattern and repeatedly formed on the flexible substrate 24 with the pattern similarly to FIG. 3B. A method of forming the foil target material is coating, sputtering, CVD or the like. The flexible substrate 24 on which the foil target 7 is formed is wound around a feed roll 26 to be formed into a roll target substrate 25, and the roll target substrate 25 is disposed in the vacuum chamber 1. One end of the flexible substrate 24 is fixed to another roll, that is, a winding roll 27. By winding up this winding roll 27, a surface to be irradiated of the target 7 is fed in a feed direction 28 of the roll target substrate. If the target 7 is damaged or worn, the winding roll 27 is rotated to feed a new surface to be irradiated of the target 7.

In the fifth embodiment, the feed directions 28 of the roll target substrates related to the feed rolls 26 and the winding rolls 27 arranged in an upper portion and a lower portion in the vacuum chamber 1, respectively, are set opposite to each other. Alternatively, the feed directions 28 may be set identical.

Furthermore, the surface to be irradiated of the target substrate 7 is set in a horizontal direction, but may be set in a perpendicular direction or set at another inclination.

Figure 8B:
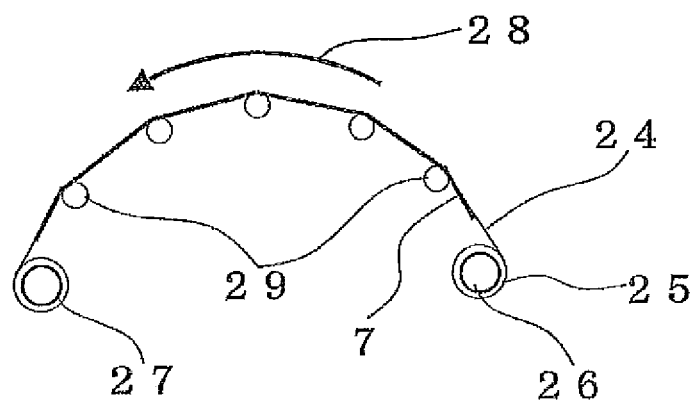
FIG. 8B is a perspective view showing the method of forming the intermediate members on the substrates by sputtering the targets according to the fifth embodiment of the present invention.

Moreover, the surface to be irradiated of the target substrate 7 is set flat, but the surface to be irradiated thereof may be curved as shown in FIG. 8B. In that case, a plurality of rolls 29 is arranged so as to give a tension to the flexible substrate 24 between the plurality of rolls 29.

In the fifth embodiment, a target substrate corresponding to the target substrate 8c shown in FIGS. 2, 4 and 5 is not arranged. Needless to say, the roll target substrate 25 in place of the target substrate 8c may be arranged. Further, the flat target substrate 8a, 8b or 8c described in the first to fourth embodiment or a combination thereof and one of the roll target substrates 25 shown in the fifth embodiment may be combined and arranged in the vacuum chamber 1.

The room-temperature bonding method and the room-temperature bonding apparatus according to the present invention can be applied to manufacturing of ultrafine structures. The room-temperature bonding method and the room-temperature bonding apparatus according to the present invention can be applied particularly to an instance of dividing many ultrafine structures such as MEMS or optical components formed on a substrate using room-temperature bonding by dicing the substrate.

In the present invention, a plurality of targets is sputtered during so-called room-temperature bonding, so that the intermediate member can be formed uniformly on surfaces to be bonded of the substrates to be bonded. Further, the intermediate member composed of a plurality of materials is formed on the surfaces to be bonded of the substrates to be bonded. Due to this, there is no need to heat the substrates during bonding as required in the conventional technique so as to secure a sufficient bonding strength and constraints regarding selection of materials of substrates to be bonded are removed. Moreover, the bonding can be performed only by arranging targets in the vacuum chamber for the room-temperature bonding to be independent of the other apparatuses. Due to this, there is no need to provide a heater and a device for forming a plurality of intermediate layers. Further, a simple room-temperature bonding apparatus obtained only by arranging targets in a conventional room-temperature bonding apparatus can be constructed.

The invention claimed is:

1. A method for room-temperature bonding a plurality of substrates via intermediate members, comprising:
    providing said plurality of substrates, only a single physical sputtering source, and a plurality of targets such that said plurality of substrates is arranged at a position away from an axis line of said only a single physical sputtering source and at least one of said plurality of targets is arranged at a position away from said axis line, said axis line starting at a center of said only a single physical sputtering source and being parallel to a direction in which said only a single physical sputtering source faces, said axis line extending beyond said only a single physical sputtering source past said plurality of substrates and at least one of said plurality of targets;
    forming said intermediate members on surfaces to be bonded of said plurality of substrates by physically sputtering said plurality of targets including the at least one said target arranged at a position away from said axis line using said only a single physical sputtering source;
    activating said surfaces to be bonded of said plurality of substrates by physical sputtering using said only a single physical sputtering source; and
    bonding said plurality of substrates.

2. A method for room-temperature bonding a plurality of substrates via intermediate members, comprising:
    providing said plurality of substrates, only a single physical sputtering source, and a target composed of a plurality of types of materials such that said plurality of substrates is arranged at a position away from an axis line of said only a single physical sputtering source and said target is arranged at a position away from said axis line, said axis line starting at a center of said only a single physical sputtering source and being parallel to a direction in which said only a single physical sputtering source faces, said axis line extending beyond said only a single physical sputtering source past said plurality of substrates and said target;

forming said intermediate member on surfaces to be bonded of said plurality of substrates by physically sputtering said target using said only a single physical sputtering source;

activating said surfaces to be bonded of said plurality of substrates by physical sputtering using said only a single physical sputtering source; and bonding said plurality of substrates.

3. The method for room-temperature bonding according to claim 1 or 2, wherein said step of forming said intermediate members on said surfaces to be bonded of said substrate and said step of activating said surfaces to be bonded of said substrate are simultaneously performed.

4. The method for room-temperature bonding according to claim 2, wherein said target includes a plurality of types of metals.

5. The method for room-temperature bonding according to claim 4, wherein a composition ratio of said intermediate members is controlled by setting a component ratio of said plurality of types of metals.

6. The method for room-temperature bonding according to claim 2, wherein said target is configured with a plurality of types of materials arranged to be independent of one another, and wherein said plurality of types of materials is simultaneously sputtered.

7. The method for room-temperature bonding according to claim 6, wherein when said plurality of types of materials is arranged on a target substrate, by setting an arrangement area ratio of said plurality of types of materials, a composition ratio of said intermediate members is controlled.

8. The method for room-temperature bonding according to claim 1, wherein each of said plurality of targets includes a plurality of types of metals.

9. The method for room-temperature bonding according to claim 8, wherein a composition ratio of said intermediate members is controlled by setting a component ratio of said plurality of metals.

10. The method for room-temperature bonding according to claim 1, wherein each of said plurality of targets is configured with a plurality of types of materials arranged to be independent of one another, and wherein said plurality of types of materials is simultaneously sputtered.

11. The method of room-temperature bonding according to claim 10, wherein when said plurality of types of materials is arranged on a target substrate, by setting an arrangement area ratio of said plurality of types of materials, a composition ratio of said intermediate members is controlled.

* * * * *